United States Patent
Yates

(10) Patent No.: US 7,163,019 B2
(45) Date of Patent: *Jan. 16, 2007

(54) METHOD OF REDUCING WATER SPOTTING AND OXIDE GROWTH ON A SEMICONDUCTOR STRUCTURE

(75) Inventor: Donald L. Yates, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 10/633,069

(22) Filed: Aug. 1, 2003

(65) Prior Publication Data

US 2004/0020521 A1 Feb. 5, 2004

Related U.S. Application Data

(60) Continuation of application No. 10/231,730, filed on Aug. 28, 2002, now Pat. No. 6,601,595, which is a continuation of application No. 09/427,789, filed on Oct. 27, 1999, now Pat. No. 6,607,001, which is a division of application No. 08/814,900, filed on Mar. 21, 1997, now Pat. No. 6,350,322.

(51) Int. Cl.
  *B08B 3/04* (2006.01)

(52) U.S. Cl. .................. 134/95.1; 134/102.1; 134/99.1; 134/186; 134/902

(58) Field of Classification Search ................ 134/95.2, 134/102.1, 186, 99.1, 902, 155
See application file for complete search history.

(56) References Cited

U.S. PATENT DOCUMENTS

| | | |
|---|---|---|
| 4,132,567 A | 1/1979 | Blackwood |
| 4,197,000 A | 4/1980 | Blackwood |

(Continued)

FOREIGN PATENT DOCUMENTS

| | | |
|---|---|---|
| EP | 0385536 | 5/1990 |
| JP | 61-154130 | 7/1986 |

(Continued)

OTHER PUBLICATIONS

Leenaars et al., *Marangoni Drying: A New Extremely Clean Drying Process*, Langmuir, vol. 6, No. 11, pp. 1701–1703.
Wong et al., "Post–Acid Rinse Enhancement Through Megasonic Quickdump Rinsing", Feb. 1997, pps. 1–7.

(Continued)

*Primary Examiner*—Frankie L. Stinson
(74) *Attorney, Agent, or Firm*—TraskBritt

(57) ABSTRACT

The present invention relates to a method of cleaning and drying a semiconductor structure in a modified conventional gas etch/rinse or dryer vessel. In an embodiment of the present invention, a semiconductor structure is placed into a first treatment vessel and chemically treated. Following the chemical treatment, the semiconductor structure is transferred directly to a second treatment vessel where it is rinsed with DI water and then dried. The second treatment vessel is flooded with both DI water and a gas that is inert to the ambient, such as nitrogen, to form a DI water bath upon which an inert atmosphere is maintained during rinsing. Next, an inert gas carrier laden with IPA vapor is fed into the second treatment vessel. After sufficient time, a layer of IPA has formed upon the surface of the DI water bath to form an IPA-DI water interface. The semiconductor structure is drawn out of the DI water bath at a rate that allows substantially all DI water, and contaminants therein, to be entrained beneath the IPA-DI water interface. In a second embodiment of the present invention, chemical treatment, rinsing, and drying are carried out in a single vessel. In a third embodiment of the present invention, a retrofitted spray/dump rinser with a lid is used for rinsing and drying according to the method of the present invention.

38 Claims, 3 Drawing Sheets

U.S. PATENT DOCUMENTS

| | | | |
|---|---|---|---|
| 4,286,541 A | | 9/1981 | Blackwood |
| 4,635,666 A | | 1/1987 | Daley et al. |
| 4,682,615 A | | 7/1987 | Burkman et al. |
| 4,911,761 A | | 3/1990 | McConnell et al. |
| 4,984,597 A | | 1/1991 | McConnell et al. |
| 4,997,490 A | | 3/1991 | Vetter et al. |
| 5,069,235 A | | 12/1991 | Vetter et al. |
| 5,089,084 A | | 2/1992 | Chhabra et al. |
| 5,095,927 A | | 3/1992 | Thompson et al. |
| 5,115,576 A | | 5/1992 | Roberson, Jr. et al. |
| 5,186,192 A | | 2/1993 | Netsu et al. |
| 5,328,867 A | | 7/1994 | Chien et al. |
| 5,355,901 A | * | 10/1994 | Mielnik et al. ............ 134/105 |
| 5,371,950 A | | 12/1994 | Schumacher |
| 5,520,744 A | | 5/1996 | Fujikawa et al. |
| 5,556,479 A | | 9/1996 | Bran |
| 5,569,330 A | * | 10/1996 | Schild et al. .................. 134/1 |
| 5,653,045 A | | 8/1997 | Ferrell |
| 5,660,642 A | * | 8/1997 | Britten ........................ 134/30 |
| 5,681,397 A | | 10/1997 | Li |
| 5,714,203 A | * | 2/1998 | Schellenberger et al. ... 427/378 |
| 5,727,578 A | | 3/1998 | Matthews |
| 5,752,532 A | | 5/1998 | Schwenkler |
| 5,845,660 A | | 12/1998 | Shindo et al. |
| 5,934,299 A | | 8/1999 | Akatsu et al. |
| 5,940,985 A | * | 8/1999 | Kamikawa et al. ........... 34/471 |
| 5,951,779 A | | 9/1999 | Koyanagi et al. |
| 5,958,146 A | | 9/1999 | Mohindra et al. |
| 6,001,191 A | | 12/1999 | Kamikawa et al. |
| 6,125,863 A | | 10/2000 | Bexten |
| 6,138,690 A | | 10/2000 | Nakatani |
| 6,143,087 A | * | 11/2000 | Walter .......................... 134/1 |
| 6,350,322 B1 | | 2/2002 | Yates |
| 6,601,595 B1 | | 8/2003 | Yates |

FOREIGN PATENT DOCUMENTS

| | | |
|---|---|---|
| JP | 4-99025 | 3/1992 |
| JP | 4-152525 | 5/1992 |
| JP | 4-253332 | 9/1992 |
| JP | 4-354128 | 12/1992 |
| JP | 5-47734 | 2/1993 |

OTHER PUBLICATIONS

*Handbook of Semiconductor Wafer Cleaning Technology*, editor W. Kem, Noyes Publications, pp. 131–151 and 405–415.

Koppenbrink et al., *Particle Reduction on Silicon Wafers as a Result of Isopropyl Alcohol Vapor Displacement Drying after Wet Processing, Particles on Surfaces 2*, editor K. Mittal, Plenum Press. pp. 235–243.

Marra et al., *Physical Principles of Marangoni Drying*, Langmuir, vol. 7, No. 11, pp. 2748–2755.

\* cited by examiner

METHOD OF REDUCING WATER SPOTTING AND OXIDE GROWTH ON A SEMICONDUCTOR STRUCTURE

CROSS-REFERENCE TO RELATED APPLICATIONS

This application is a continuation of application Ser. No. 10/231,730, filed Aug. 28, 2002, pending now U.S. Pat. No. 6,601,595 issued Aug. 5, 2003, which is a continuation of application Ser. No. 09/427,789, filed Oct. 27, 1999, pending now U.S. Pat. No. 6,607,001 issued August 19, 2003, which is a divisional of application Ser. No. 08/814,900, filed Mar. 21, 1997, now U.S. Pat. 6,350,322 issued Feb. 26, 2002.

BACKGROUND OF THE INVENTION

1. Field of the Invention

The present invention relates to drying semiconductor structures. More particularly, the present invention relates to the minimization of water spotting and of oxide growth that are experienced on semiconductor structures during chemical treatment steps, deionized (DI) water rinse steps, and drying steps. Examples of minimization of water spotting and of oxide growth are given for an HF rinse process in which the steps of DI water rinsing and drying are combined.

2. State of the Art

Producing a substantially impurity-free semiconductor structure is an ongoing challenge during fabrication of operable integrated circuits and other microelectronic devices. During fabrication, several operations are completed with a chemical treatment such as a polysilicon etching, a photoresist stripping, an RCA cleaning, or a buffered oxide etching (BOE). Following a chemical treatment, rinsing the structure to remove treatment chemicals is required.

Following a chemical treatment such as an HF rinse cleaning, a semiconductor structure is typically transferred to a vessel for a DI water rinse and then to a dryer to be dried. With each transfer of the semiconductor structure during fabrication between processing vessels, the possibility of contamination increases and, with that, also the likelihood of lower process yield. In chemical treatments of semiconductor structures that result in exposed hydrophobic surfaces, the possibility of oxidation and particle contamination is high.

During an HF-last rinse of a semiconductor structure with exposed silicon, for example, a significant number of $(Si)_2$=O bonds are changed to Si—H bonds. About ten to twenty percent of the changed bonds, however, are Si—F instead of the preferred Si—H. During the industry standard DI water rinse that follows most chemical treatments, the Si—F bonds in this example are easily washed off, and oxidation of semiconductor materials, such as silicon, occurs while transferring the semiconductor structure from a rinsing vessel to a drying vessel. Oxidation can occur both during the transfer to the drying vessel and while the semiconductor structure resides in the drying vessel prior to drying.

Before the semiconductor device is moved to the next fabrication phase, substantially complete drying must be accomplished because any water that remains on the surface of a semiconductor structure has the potential of interfering with subsequent processing. Drying can be accomplished in spin-rinse dryers (SRDs), Marangoni dryers, axial dryers and others used in the art.

Various drying techniques such as spin drying also cause water spotting. During spin drying, water spotting droplet tracks are left on the hydrophobic faces of the semiconductor structures. These water spotting tracks are formed from slight impurities contained in the DI water droplets. Water spotting is caused due to the hydrophobic nature of the cleaned silicon and other surfaces such as metallization lines.

As DI water is spun off from the hydrophobic face of a semiconductor structure, water droplet size decreases. Any portion of the DI water droplet that is not pure water is attracted to the hydrophobic surfaces of the semiconductor structure, while the water portion is repelled. Because the water droplets become exceedingly small, dissolved impurities are more strongly attracted to the hydrophobic surfaces of the semiconductor structure than they are to remaining in solution within the water droplet.

The Marangoni drying technique reduces water spotting that is incident to spin drying. In the Marangoni drying technique, a chemically treated semiconductor structure is DI water rinsed, transferred to the Marangoni dryer, immersed in a DI water bath, and drawn through an isopropyl alcohol (IPA) layer that rests on the surface of the DI water bath. In the Marangoni technique, the forces that attract impurities to exposed hydrophobic semiconductor structure surfaces are balanced by the bulk of the water in the relatively pure DI water bath that tends to keep the impurities in solution. When employing the Marangoni drying technique, the DI water and its impurities are entrained beneath the water-IPA interface while the semiconductor structure is drawn through the interface.

Marangoni drying reduces water spotting, but it does not ameliorate oxidative contamination that occurs upon a semiconductor structure during transfer of the semiconductor structure from the DI water rinsing vessel to the dryer. Thus, elimination of the deleterious effects of water spotting may be overshadowed by contamination of the semiconductor structure experienced simply during transfer from one vessel to another.

Because a Marangoni dryer may have moving parts, the function of which is to draw a wafer boat out of a DI water bath, the possibility of particulate contamination arises, which contamination is caused by abrasion of surfaces on the moving parts.

What is needed is a method of rinsing and drying semiconductor structures, particularly hydrophobic semiconductor structures, in such a way as to substantially eliminate oxide contamination incident to semiconductor structure transfer from vessel to vessel and by water spotting incident to spin drying. What is also needed is a device that will accomplish the inventive method while simplifying the Marangoni technique and equipment.

BRIEF SUMMARY OF THE INVENTION

The present invention relates to a method of cleaning and drying semiconductor structures. The present invention also relates to a method of using a conventional gas etch/rinse vessel, or a conventional dryer vessel. The present invention also relates to an apparatus that accomplishes the inventive method. The present invention reduces the likelihood of oxide contamination and the like, as well as the incidence of water spotting.

In a first embodiment of the present invention, a semiconductor structure is placed into a first treatment vessel for a chemical treatment. Following the chemical treatment, the semiconductor structure is transferred directly from the first treatment vessel to a second treatment vessel. The semiconductor structure is rinsed with DI water in the second treatment vessel. Next, the second treatment vessel is flooded with DI water to form a DI water bath. The second treatment vessel may also be optionally flooded with a gas that is inert to the ambient, such as nitrogen, to form an inert atmosphere in the second treatment vessel. The inert gas forming the inert atmosphere is intended herein to mean a gas that does not substantially react with or otherwise contaminate the semiconductor structure or the vessel in which the inert atmosphere is formed under the processing conditions set forth herein. The inert atmosphere is maintained during rinsing. Following rinsing, a gaseous stream, such as nitrogen, that is laden with IPA vapor is fed into the second treatment vessel.

After a selected period of time, a layer of IPA has formed upon the surface of the DI water bath to form an IPA-DI water interface. The semiconductor structure is drawn out of the DI water bath at a preferred rate that causes substantially all the DI water, and contaminants therein, to be entrained beneath the IPA-DI water interface.

In a second embodiment of the present invention, a dry etch is performed. The process of the second embodiment comprises first placing a semiconductor structure into a gas etch chamber. After placing a semiconductor structure into a gas etch chamber, the gas etch chamber is sealed and gas etching of the semiconductor structure commences. Following gas etching, the semiconductor structure is rinsed with DI water. After rinsing and an optional washing of the semiconductor structure in the gas etch chamber, the gas etch chamber is purged of any gas that is not inert to the semiconductor structure or to the gas etch chamber. The semiconductor structure is then submerged in DI water by flooding the gas etch chamber, wherein a surface of DI water forms above the semiconductor structure. Nitrogen gas laden with IPA vapor is introduced into the gas etch chamber to form an IPA-DI water interface upon the surface of the DI water. Finally, the gas etch chamber is drained by displacing the DI water bath with more IPA-laden nitrogen. As the gas etch chamber is drained at a preferred rate, the IPA-DI water interface functions as a dynamic barrier to the DI water and substantially "wipes down" the semiconductor structure by substantially entraining the DI water, and contaminants therein, beneath the IPA.

In a third embodiment of the present invention, a rinser is retrofitted with a lid and a fail-shut valve. In the third embodiment, the process of chemical treatment is carried out conventionally, but DI water rinsing and drying both occur within the rinser. Following sufficient rinse cycles, IPA-laden nitrogen is fed into the rinser in a manner similar to the method of the second embodiment. Entrainment of substantially all DI water, and contaminants therein, beneath the IPA layer is accomplished by displacement of the last spray/dump DI water volume with an IPA-DI water interface as set forth above. In this embodiment, retrofitted rinsers include spray/dump rinsers, overflow rinsers, cascade rinsers, and Marangoni dryers that have been retrofitted with rinsing capabilities.

These and other features of the present invention will become more fully apparent from the following description and appended claims, or may be learned by the practice of the invention as set forth hereinafter.

BRIEF DESCRIPTION OF THE SEVERAL VIEWS OF THE DRAWINGS

In order to obtain the above-recited and other advantages of the invention, a more particular description of the invention briefly described above will be rendered by reference to specific embodiments thereof which are illustrated in the appended drawings. Understanding that these drawings depict only typical embodiments of the invention and are not, therefore, to be considered to be limiting of its scope, the invention will be described and explained with additional specificity and detail through the use of the accompanying drawings in which.

DETAILED DESCRIPTION OF THE INVENTION

Figure 1:
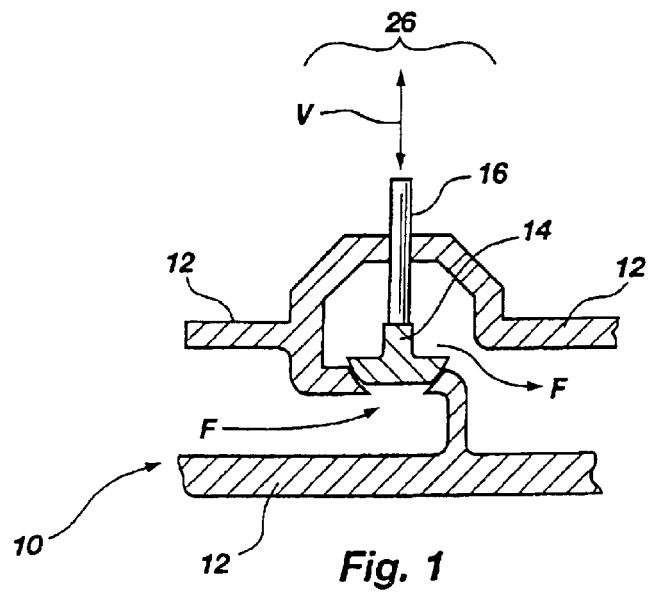
FIG. 1 is a cross-sectional elevational view of a glove valve that can be installed in a Marangoni dryer, a spray/dump rinser, and other wet processing vessels in order to practice the method of the present invention.

The present invention relates to a method of cleaning and drying semiconductor structures. The present invention also relates to a method of using a conventional gas etch/rinse vessel, or a conventional dryer, or a conventional rinser in conjunction with the inventive method. The present invention also relates to an apparatus that accomplishes the inventive method. The present invention reduces the likelihood of oxide contamination or the like, as well as the incidence of water spotting.

Rinsing by the method of the present invention is usually carried out with DI water. Other rinsing solutions may be used such as aqueous hydrogen peroxide. Drying by the method of the present invention comprises forming a substantially continuous layer of a drying liquid upon the upper surface of a DI water bath in which the semiconductor structure is submerged. Following formation of the substantially continuous layer of the drying liquid, the semiconductor structure is drawn through the substantially continuous layer of the drying liquid. Both the DI water and contaminants therein are entrained beneath the substantially continuous layer of the drying liquid in the DI water bath and are, therefore, substantially removed from the semiconductor structure.

The drying liquid comprises a volatile liquid such as IPA. Other drying liquids are contemplated to be, but need not be, derived from an anhydrous organic vapor, such as acetone, chloroform, methanol, carbon tetrachloride, benzene, ethanol, ethyl acetate, hexane, 1-propanol, and 2-propanol, and equivalents. By reading the disclosure of the present invention and by practicing the present invention, one of ordinary skill in the art will recognize that anhydrous organic liquids or the like may be used in the method of the present invention. The skilled practitioner will recognize that, although a water-miscible drying liquid such as IPA may be used, such liquids are preferred to be more volatile than the DI water used for rinsing, and such liquids are preferred in that they are not prone to cause deleterious chemical effects upon the semiconductor structure.

In order to avoid unwanted oxidation or other contamination incident to ambient air exposure that may occur during and after rinsing, the method of the present invention comprises filling the rinsing vessel with a gas that will not react detrimentally with the semiconductor structure. The gas preferably will be inert to both the semiconductor structure and to the rinsing vessel, such as nitrogen. Other gases that may be used include all the noble gases, methane, ethane, and the like. Other gases may include the drying liquid in vapor form. The preferred gas, if a gas is used, is nitrogen.

In a first embodiment of the present invention, a semiconductor structure is placed into a first treatment vessel and chemically treated. Chemical treatment may be any number of treatments such as rinsing the semiconductor structure in an aqueous HF solution, performing an HF dry etch on the semiconductor structure, performing a buffered oxide etch on the semiconductor structure, performing a polysilicon etch on the semiconductor structure, other wet or dry etching processes, photoresist stripping, or RCA cleaning. In an example of the first embodiment, an HF rinse is carried out in which aqueous HF contacts the semiconductor structure and is optionally filtered and recirculated. The aqueous HF is discarded after a number of uses, depending upon the specific application.

Following the chemical treatment step, a rinsing step is carried out usually by transferring the semiconductor structure to a second treatment vessel and performing a DI water rinse. DI water rinsing vessels are known in the art such as a cascade rinser, an overflow rinser, a spray/dump rinser, a spin/rinse dryer, an etcher/rinser, and others. In the first embodiment of the present invention, the rinsing vessel is omitted. The semiconductor structure is transferred directly from the first treatment vessel to a second treatment vessel, rinsed in the second treatment vessel, and then dried. In this first embodiment of the present invention, the semiconductor structure is transferred from an HF-last cleaning vessel to a Marangoni dryer that has been retrofitted with means for contacting the semiconductor structure with DI water, such as with spray nozzles for rinsing the semiconductor structure.

In the first example of the first embodiment of the present invention, most of the hydrophobic surfaces of the semiconductor structure are hydrogen terminated, e.g. M—H, where M represents Si, Al, Al alloys, and other metals. About ten to twenty percent of the bonds, however, are M—F instead of the preferred M—H. Because significant oxidation occurs only after the rinsing, and because significant water spotting occurs only during spin drying or post-rinse (pre-dry) atmospheric exposure, exposing the semiconductor structure to the ambient by transferring it from an HF rinsing treatment vessel to a rinse/dry treatment vessel under conventional clean room conditions results in some contamination of the semiconductor structure. The inventive method, therefore, does not expose the semiconductor structure to ambient air after rinsing.

The second treatment vessel is flooded with an inert gas such as nitrogen to create an inert atmosphere, and the inert atmosphere is maintained during rinsing. Maintaining an inert atmosphere prevents unwanted oxidation caused by oxygen contact with freshly broken M—F bonds that occur during rinsing. Alternatively, no inert gas per se is used, but rather the second treatment vessel is flooded with an anhydrous organic vapor such as with IPA vapor. Rinsing is carried out in such a way that the IPA vapor is not substantially flushed from the second treatment vessel.

Rinsing is commenced within the second treatment vessel. Following appropriate rinsing, the second treatment vessel is optionally cleaned and a DI water bath is formed in the second treatment vessel. A nitrogen stream that is laden with IPA vapor is fed into the second treatment vessel. Alternatively, an IPA stream with no nitrogen or other inert gas acting as a carrier is fed to the second treatment vessel. After a preferred period of time, a layer of IPA has formed upon the surface of the DI water bath to form an IPA-DI water interface. When a sufficient layer of IPA vapor has formed upon the surface of the DI water bath, the semiconductor structure is drawn out of the DI water bath at a rate that allows substantially all DI water, and contaminants therein, on the semiconductor structure to be entrained beneath the IPA-DI water interface. Impurities in the DI water bath are substantially all retained in the DI water bath as the semiconductor structure is drawn through the IPA-DI water interface. By this method, unwanted oxidation incident to ambient exposure of the semiconductor structure is minimized, and unwanted water spotting incident to spin drying and to post-rinse atmospheric exposure is eliminated.

In a second embodiment of the present invention, the chemical treatment is an HF gas etch, by way of non-limiting example. Other etching may be carried out, such as wet or dry etching. Following the chemical treatment, a DI water rinse followed by drying is carried out. Single-chamber HF gas etching may be done, or multiple-chamber etching may be done by using an apparatus such as that described in U.S. Pat. No. 5,089,084 issued to Chhabra et al., the disclosure of which is incorporated herein by specific reference.

The process of the second embodiment comprises first placing a semiconductor structure into a gas etch chamber. The gas etch chamber is sealed and gas etching of the semiconductor structure commences. Following gas etching, the semiconductor structure is rinsed with DI water in an inert atmosphere and optionally washed in the gas etch chamber. The semiconductor structure is then submerged in DI water by flooding the gas etch chamber with DI water, wherein a surface of DI water forms above the semiconductor structure. An inert carrier gas, such as nitrogen gas laden with IPA vapor, is introduced into the gas etch chamber to form an IPA-DI water interface upon the surface of the DI water. Alternatively, an IPA vapor without an inert carrier gas is introduced into the gas etch chamber to form an IPA-DI water interface upon the surface of the DI water. Finally, the gas etch chamber is drained by displacing the DI water bath with more IPA-laden nitrogen, by more IPA alone, or by nitrogen alone, whereby the IPA layer entrains the DI water, and contaminants therein, beneath itself while the DI water is draining or being displaced.

Figure 2:
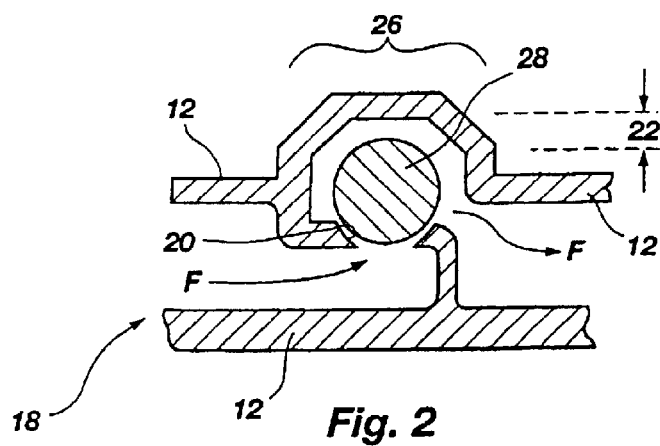
FIG. 2 is a cross-sectional elevational view of a check valve that can be installed in a Marangoni dryer, a spray/dump rinser, and other wet processing vessels in order to practice the method of the present invention.
Figure 3:
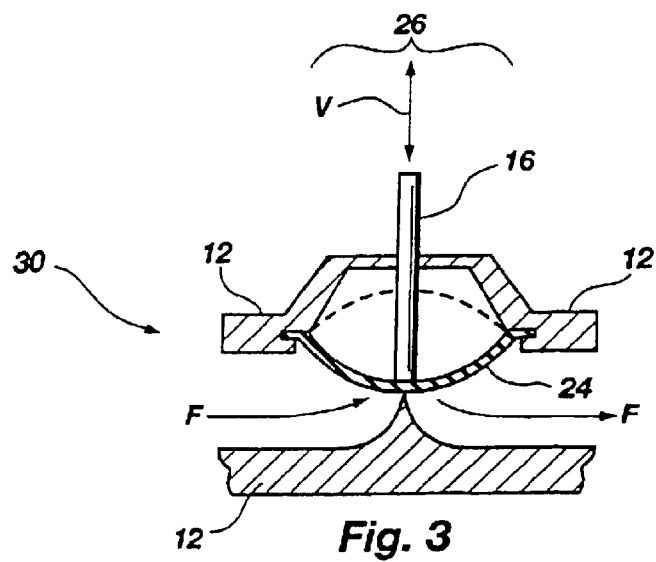
FIG. 3 is a cross-sectional elevational view of a diaphragm valve that can be installed in a Marangoni dryer, a spray/dump rinser, and other wet processing vessels in order to practice the method of the present invention.

The method of draining the gas etch chamber by displacing the DI water bath with a gas or a vapor, or both, can be accomplished by installing an effluent valve, as seen in FIGS. 1–3, in the gas etch chamber at a level below the lowest portion of the semiconductor structure. A preferred valve is one that is fail-shut, but that opens by sufficient positive pressure on the gas etch chamber side of the valve. In FIG. 1, a glove valve 10 is installed within an effluent pipe 12 that can be installed in a gas etch chamber according to the second embodiment of the present invention. Glove valve 10 comprises a stopper 14 that is part of a valve housing 26 that is part of effluent pipe 12. Stopper 14 is attached to a valve shaft 16 that moves in directions V. Valve shaft 16 may be attached to a spring or some other device that provides stopper 14 with a selected resistance against allowing an effluent flow F therethrough. The selected resistance can be chosen depending upon the specific application.

In an example of the second embodiment of the present invention, a preferred IPA-DI water interface thickness is selected to optimize entrainment beneath the IPA-DI water interface of all dissolved impurities contained within the DI water bath. A selected resistance is set to resist movement of valve shaft 16 caused by pressure against the gas etch chamber side of stopper 14. The selected resistance allows a specific pressure within the gas etch chamber, such that the IPA-DI water interface will have a preferred thickness, and such that displacement of the DI water bath is accomplished only by further feeding of the gases, such as IPA-laden nitrogen, IPA alone, or nitrogen alone, to the gas etch chamber.

Another valve scheme, seen in FIG. 2, includes a check valve 18 that comprises a ball 28 that rests in a fail-shut mode against a sphere-contoured valve seat 20. One advantage of check valve 18 is that no moving part must breach valve housing 26, such as is seen in FIG. 1 where valve shaft 16 is required for a glove valve or a diaphragm valve. With no breach of valve housing 26, the possibility of abraded parts caused by dynamic frictional contact of valve shaft 16 against valve housing 26 is eliminated.

Check valve 18 can be configured within valve housing 26 such that a selected clearance 22 limits how high ball 28 of check valve 18 may rise and, therefore, how large an effluent opening allows effluent flow F to pass through. It can be seen in FIG. 2 that clearance 22 could be configured to allow ball 28 of check valve 18 to move less than one diameter thereof, or to move greater than one diameter thereof. It will be appreciated by one of ordinary skill in the art that using the present disclosure as a guide, clearance 22 may be adjusted within a single valve housing by placing a screw or piston above ball 28 of check valve 18 to adjustably limit its upward motion.

Thus, for a process that merits well-defined process parameters and that is part of a high-volume fabrication, clearance 22 of valve housing 26 for check valve 18 may be unadjustable. On the other hand, for an apparatus that is used for various processes that require selected dissimilar conditions, valve housing 26 for check valve 18 may have an adjustable clearance 22.

Another valve scheme is a diaphragm valve 30 illustrated in FIG. 3. Diaphragm valve 30 comprises a flexible diaphragm 24 that is connected to valve shaft 16 similarly to glove valve 10. It can be appreciated by one of ordinary skill in the art that the function of the valves illustrated in FIGS. 1–3 can also be accomplished by a simple goose neck, wherein the height of the goose neck may be selected to allow pressures that optimize the IPA-DI water interface or other processing parameters as the gas etch chamber is drained.

The process of entraining DI water and thereby substantially removing DI water, and contaminants therein, from the semiconductor structure by the method of the present invention may be accomplished in the second embodiment by a rapid displacement of the DI water bath such that the IPA layer "wipes down" the semiconductor structure in a substantially continuous stroke. A rapid displacement may be accomplished, for example, by pushing IPA-laden nitrogen from a piston that displaces a volume approximately equal to the volume of the gas etch chamber.

Where a rapid displacement of the DI water bath from the gas etch chamber is not a preferred variation of draining the gas etch chamber, IPA-laden nitrogen may be fed to the gas etch chamber by conventionally used equipment and methods such as those used in a STEAG® Marangoni dryer.

Figure 4:
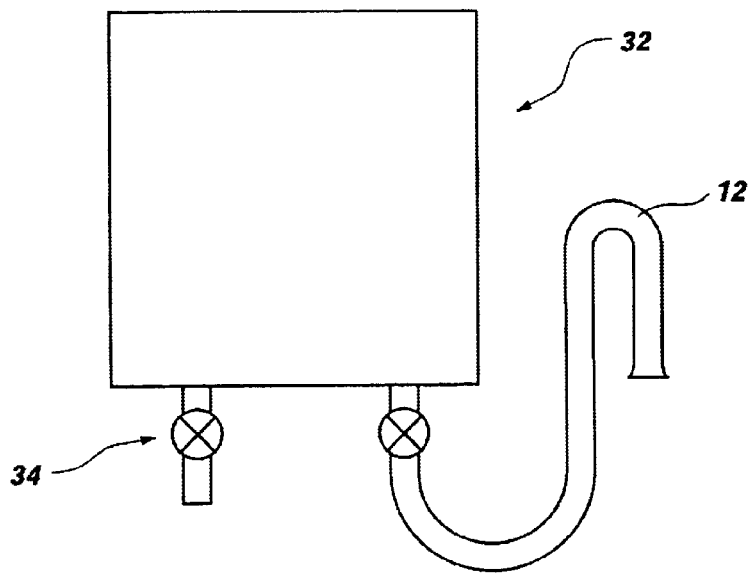
FIG. 4 is an elevational side view of a treatment vessel used in the method of the present invention in which fail-shut valves or simple gate valves are used to allow draining of the treatment vessel according to the method of the present invention.
Figures 5, 6:
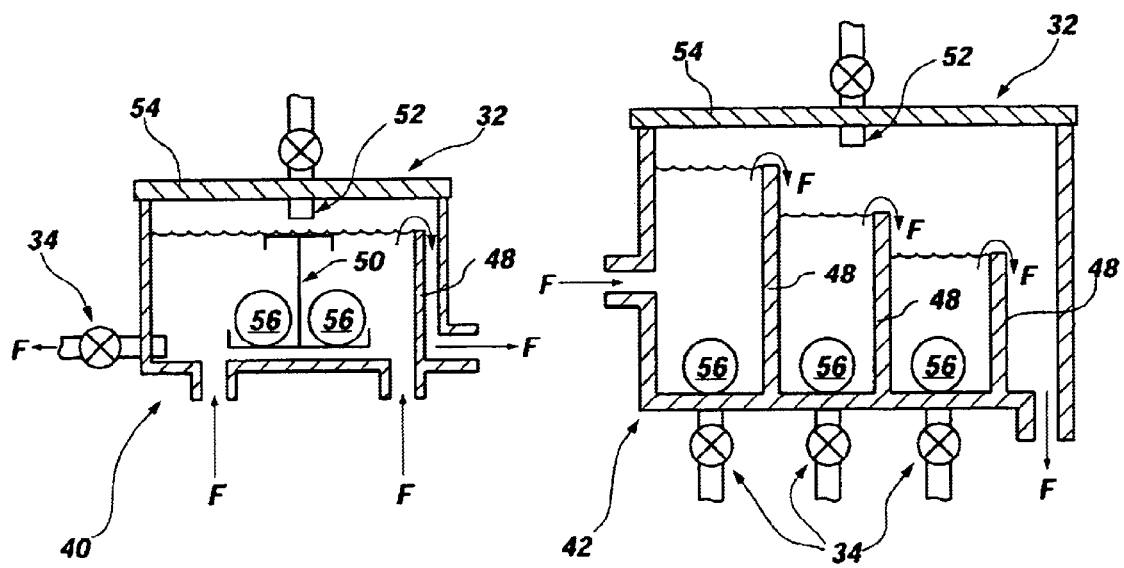
FIG. 5 is an elevational side view of a sealed overflow rinse vessel used in the present invention in which a vessel wall is illustrated as transparent.
FIG. 6 is an elevational side view of a sealed spray/dump rinse vessel used in the present invention in which a vessel wall is illustrated as transparent.

A third embodiment of the present invention comprises a retrofitted spray/dump rinser 32 with a rinser-sealable lid 54 and a valve 34 such as those depicted in FIGS. 4–6. In the third embodiment, the process of chemical treatment is carried out conventionally, but DI water rinsing and drying both occur within the rinser. Following sufficient spray/dump cycles, IPA-laden nitrogen or the like is fed into the rinser in a manner similar to the method of the second embodiment of the present invention. Removal of DI water from the semiconductor structure comprises displacement of the last spray/dump DI water volume by forming an IPA-DI water interface as set forth above.

The artisan will appreciate that other rinsers may be retrofitted to practice the method of the present invention. For example, an overflow rinser or a cascade rinser may be retrofitted, as well as spinner rinser/dryers. FIG. 5 illustrates an elevational side view of an overflow rinser 40 that has been retrofitted with a lid 54, a vapor-gas inlet 52, a semiconductor structure holder 50, and at least one fail-shut valve 34 or a goose neck. During the process of passing an IPA-DI water interface across a semiconductor structure 56, IPA-laden nitrogen gas or the like is fed through vapor-gas inlet 52 while influent DI water that normally enters from below overflow rinser 40 is shut off.

FIG. 6 illustrates an elevational side view of a retrofitted cascade rinser 42 in which semiconductor structure 56 is substantially batch treated instead of counter-current treated. Influent DI water flows in the direction F and spills over weirs 48. After sufficient rinsing, such that semiconductor structure 56 contacted with the DI water that is about to exit cascade rinser 42 is substantially as thoroughly rinsed as semiconductor structure 56 contacted with the first influent DI water, influent DI water is shut off and IPA-laden nitrogen gas or the like is fed through vapor-gas inlet 52. Fail-shut valves 34 are opened and the pressure of influent IPA-laden nitrogen gas that is fed through vapor-gas inlet 52 displaces all DI water contained within cascade rinser 42.

Draining each stage in cascade rinser 42 may require that fail-shut valve 34 in the deepest stage be opened first. DI water then drains from the deepest stage until the DI water depth in the deepest stage matches that of the next deepest stage, at which point fail-shut valve 34 in that stage opens, and so forth for each stage.

Another method of assuring uniform draining of each stage relative to semiconductor structures 56 is to set semiconductor structures 56 upon racks (not shown). By placing semiconductor structures 56 upon racks, the semiconductor structure 56 in the deepest stage will have completely surfaced before all DI water has exited from the shallowest stage.

Figure 7:
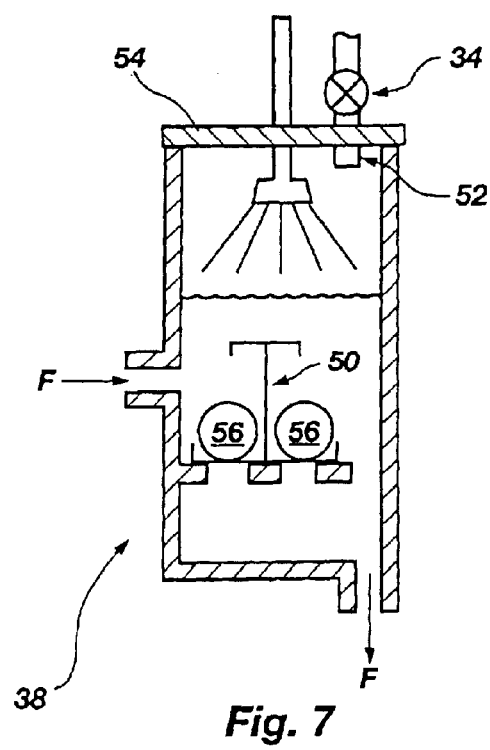
FIG. 7 is an elevational side view of a sealed cascade rinse vessel used in the present invention in which a vessel wall is illustrated as transparent.

FIG. 7 illustrates an elevational side view of a spray/dump rinser 38 that has been retrofitted with sealable lid 54 and vapor-gas inlet 52. In the method of the present invention, the normal spray/dump cycle is carried out in an inert atmosphere that may be supplied through vapor-gas inlet 52. The final flooding of spray/dump rinser 38 comprises forming an IPA layer upon the DI water bath and either drawing semiconductor structure 56 through the IPA surface or draining the DI water bath as set forth above such that the IPA surface passes across semiconductor structure 56.

Figure 8:
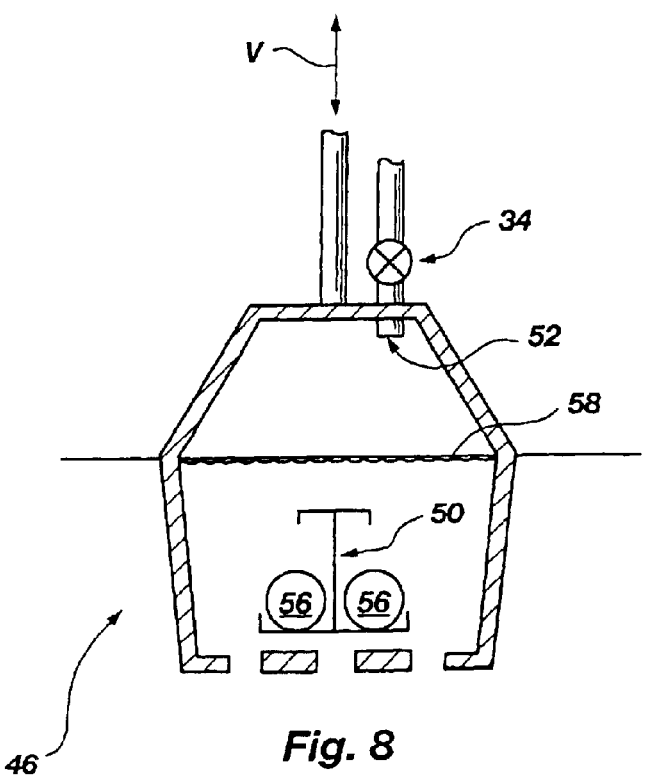
FIG. 8 is an elevational side view of a sealed Marangoni dryer type rinse/dry vessel used in the present invention in which a vessel wall is illustrated as transparent.

FIG. 8 illustrates an elevational side view of a Marangoni type dryer 46 in which semiconductor structures 56 are held in semiconductor structure holder 50. In the method of the present invention, rinsing is carried out within Marangoni type dryer 46 in an inert atmosphere. The method concludes by drawing semiconductor structure 56 through an IPA layer 58, or by draining the DI water bath such that IPA layer 58 passes across semiconductor structure 56. As semiconductor structure 56 and IPA layer 58 pass each other, the DI water bath, and contaminants therein, are entrained beneath IPA layer 58 such that substantially all DI water is removed from semiconductor structure 56.

The present invention may be embodied in other specific forms without departing from its spirit or essential characteristics. The described embodiments are to be considered in all respects only as illustrative and not restrictive. The scope of the invention is, therefore, indicated by the appended claims and their combination in whole or in part rather than by the foregoing description. All changes that come within the meaning and range of equivalency of the claims are to be embraced within their scope.

What is claimed is:

1. A drying system for a semiconductor structure comprising:
    a vessel having a top, a bottom, and a plurality of at least three sides, the vessel including a semiconductor stage for disposing the semiconductor structure thereon;
    a DI water inlet configured to supply DI water in the vessel to at least partially fill the vessel to a level that would allow the semiconductor structure disposed on the semiconductor stage to be submerged in the DI water;
    at least one gas inlet configured to supply a gas inert to the semiconductor structure to substantially fill the vessel so that the gas is maintained above the level of the DI water, the at least one gas inlet connected to a fail-shut valve, the at least one gas inlet comprising one of an inlet in the top of the vessel and an inlet in at least one side of the at least three sides of the vessel; and
    a plurality of liquid inlets configured to supply a liquid to the vessel so that the liquid is disposed between the DI water and the gas, the vessel configured such that the semiconductor stage having the semiconductor structure disposed thereon and an upper surface of the DI water move relative to each other so that the semiconductor structure is exposed through the upper surface of the DI water to the gas to rinse and dry the semiconductor structure in the vessel.

2. The system of claim 1, wherein the vessel includes a plurality of outlets therefrom.

3. The system of claim 1, further comprising:
    at least one outlet in the vessel for allowing the gas or DI water to be removed from the vessel; and
    a fail-shut valve connected to the at least one outlet in the vessel.

4. The system of claim 1, further comprising at least one outlet in the bottom of the vessel.

5. The system of claim 1, further comprising at least one outlet in at least one side of the at least three sides of the vessel.

6. The system of claim 1, wherein the vessel comprises a plurality of weirs.

7. The system of claim 1, wherein the vessel includes a plurality of compartments therein.

8. The system of claim 7, further comprising:
    at least one outlet connected to each compartment of the plurality of compartments of the vessel.

9. The system of claim 1, wherein the vessel includes a plurality of compartments therein for allowing flow of liquid in the vessel from one compartment to an adjacent compartment.

10. The system of claim 1, further comprising a rinsing apparatus having at least one spray nozzle with a portion thereof located in the vessel.

11. The system of claim 1, wherein the vessel includes a shelf therein located above the bottom of the vessel.

12. The system of claim 11, wherein the shelf includes at least one aperture therein.

13. The system of claim 1, further comprising:
    a valve apparatus connected to at least one liquid inlet of the plurality of liquid inlets.

14. The system of claim 1, wherein the vessel comprises a dry etcher.

15. The system of claim 1, wherein the vessel comprises a cascade rinser.

16. The system of claim 1, wherein the vessel comprises an overflow rinser.

17. The system of claim 1, wherein the vessel comprises a Marangoni dryer.

18. The system of claim 1, wherein the semiconductor stage is raisable so that the semiconductor structure is drawn through the upper surface of the DI water to the gas.

19. The system of claim 1, wherein the vessel comprises at least one drain to lower the upper surface of the DI water to facilitate exposing the semiconductor structure to the gas.

20. A system for a semiconductor structure comprising:
    a multi-sided vessel having a top and a bottom, the multi-sided vessel including a semiconductor stage for disposing the semiconductor structure thereon;
    a DI water inlet configured to supply DI water in the multi-sided vessel to at least partially fill the multi-sided vessel to a level that would allow the semiconductor structure disposed on the semiconductor stage to be submerged in the DI water;
    at least one gas inlet configured to supply a gas inert to the semiconductor structure to substantially fill the multi-sided vessel so that the gas is maintained above the level of the DI water, the at least one gas inlet connected to a fail-shut valve, the at least one gas inlet comprising one of an inlet in the top of the multi-sided vessel and an inlet in the at least one side of the multi-sided vessel; and
    a plurality of liquid inlets configured to supply a liquid to the multi-sided vessel so that the liquid is disposed between the DI water and the gas, the multi-sided vessel configured such that the semiconductor stage having the semiconductor structure disposed thereon and an upper surface of the DI water move relative to each other so that the semiconductor structure is exposed through the upper surface of the DI water to the gas to rinse and dry the semiconductor structure in the multi-sided vessel.

21. The system of claim 20, wherein the vessel includes a plurality of outlets therefrom.

22. The system of claim 20, further comprising:
    at least one outlet in the multi-sided vessel for allowing the gas or DI water to be removed from the multi-sided vessel; and a fail-shut valve connected to the at least one outlet in the multi-sided vessel.

23. The system of claim 20, further comprising at least one outlet in the bottom of the multi-sided vessel.

24. The system of claim 20, further comprising at least one outlet in at least one side of the multi-sided vessel.

25. The system of claim 20, wherein the multi-sided vessel comprises a plurality of weirs.

26. The system of claim 20, wherein the multi-sided vessel includes a plurality of compartments therein.

27. The system of claim 20, wherein the multi-sided vessel includes a plurality of compartments therein for allowing flow of liquid in the multi-sided vessel from one compartment to an adjacent compartment.

28. The system of claim 27, further comprising:
at least one outlet connected to each compartment of the plurality of compartments of the multi-sided vessel.

29. The system of claim 20, further comprising a rinsing apparatus having at least one spray nozzle with a portion thereof located in the multi-sided vessel.

30. The system of claim 29, wherein the shelf includes at least one aperture therein.

31. The system of claim 20, wherein the vessel includes a shelf therein located above the bottom of the multi-sided vessel.

32. The system of claim 20, further comprising:
a valve apparatus connected to at least one liquid inlet of the plurality of liquid inlets.

33. The system of claim 20, wherein the multi-sided vessel comprises a dry etcher.

34. The system of claim 20, wherein the multi-sided vessel comprises a cascade rinser.

35. The system of claim 20, wherein the multi-sided vessel comprises an overflow rinser.

36. The system of claim 20, wherein the multi-sided vessel comprises a Marangoni dryer.

37. The system of claim 20, wherein the semiconductor stage is raisable so that the semiconductor structure is drawn through the upper surface of the DI water to the gas.

38. The system of claim 20, wherein the multi-sided vessel comprises at least one drain to lower the upper surface of the DI water to facilitate exposing the semiconductor structure to the gas.

* * * * *

UNITED STATES PATENT AND TRADEMARK OFFICE
CERTIFICATE OF CORRECTION

PATENT NO. : 7,163,019 B2
APPLICATION NO. : 10/633069
DATED : January 16, 2007
INVENTOR(S) : Donald L. Yates It is certified that error appears in the above-identified patent and that said Letters Patent is hereby corrected as shown below:

On the title page:
In ITEM (56) "References Cited,
 U.S. Patent Documents,"
PAGE 2, LINE 5, after reference "4,911761" insert --4,962,776  10/1990 Liu et al.--
PAGE 2, LINE 9, after reference "5,069,236" insert --5,078,832  1/19992 Tanaka--
PAGE 2, LINE 15, after reference "5,520,734" insert --5,537,508  7/1996 Ebbing et al.--
PAGE 2, LINE 20, after reference "5,714,203" insert --5,715,612  2/1998 Schwenkler--
PAGE 2, LINE 3, after reference "6,001,191" insert --6,004,399  12/1998 Wong et al.--

In ITEM (56) "References Cited, On Title page
 Foreign Patent Documents,"
PAGE 1, LINE 2, after reference "EP  0386636  5/1990" insert --JP 60-103349  6/1985--
PAGE 2, LINE 5, after reference "JP  5-47734" insert --JP 05-206096  8/1983--
PAGE 2, LINE 6, after reference "JP-06-029278" insert --JP 06-029278  2/1994--

In ITEM (56) "References Cited,
 Other Publications,"
PAGE 2, LINE 2, change "W. Kem" to --W. Kern--

UNITED STATES PATENT AND TRADEMARK OFFICE
CERTIFICATE OF CORRECTION

PATENT NO. : 7,163,019 B2
APPLICATION NO. : 10/633069
DATED : January 16, 2007
INVENTOR(S) : Donald L. Yates It is certified that error appears in the above-identified patent and that said Letters Patent is hereby corrected as shown below:

|  | COLUMN 1, | LINE 9, | after "Aug. 28, 2002," delete "pending" |
|---|---|---|---|
|  | COLUMN 1, | LINE 11-12, | after "Oct. 27, 1999," delete "pending" |
| CLAIM 31, | COLUMN 12, | LINE 1, | after "the" and before "vessel" insert --multi-sided-- |

Signed and Sealed this

Sixth Day of November, 2007

JON W. DUDAS
*Director of the United States Patent and Trademark Office*